United States Patent
Chen et al.

(10) Patent No.: US 6,206,708 B1
(45) Date of Patent: Mar. 27, 2001

(54) THROUGH VIA PLATE ELECTRICAL CONNECTOR AND METHOD OF MANUFACTURE THEREOF

(75) Inventors: Shiaw-Jong S. Chen, Plano; Roger J. Hooey, Rockwall; Robert E. Radke, Garland, all of TX (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/482,837

(22) Filed: Jan. 13, 2000

(51) Int. Cl.[7] .................................................. H01R 12/00
(52) U.S. Cl. .............................. 439/82; 174/266; 439/931
(58) Field of Search .................................... 174/262, 264, 174/265, 266; 439/931, 82, 485, 487

(56) References Cited

U.S. PATENT DOCUMENTS

| | | | | |
|---|---|---|---|---|
| Re. 29,784 | * | 9/1978 | Chadwick et al. ................... | 174/266 |
| 3,934,334 | * | 1/1976 | Hanni ................................. | 174/266 |
| 3,934,335 | * | 1/1976 | Nelson ............................... | 174/266 |
| 4,894,271 | * | 1/1990 | Hani et al. ......................... | 174/264 |
| 5,374,788 | * | 12/1994 | Endoh et al. ...................... | 174/266 |
| 5,414,224 | * | 5/1995 | Adasko et al. .................... | 174/262 |
| 5,590,460 | * | 1/1997 | DiStefano et al. ................ | 174/265 |
| 5,835,350 | | 11/1998 | Stevens ............................. | 361/704 |

OTHER PUBLICATIONS

U.S. Patent Application Serial No. 09/482,839 filed on Jan. 13, 2000 entitled "Integrated Active Cooling Device for Board Mounted Electronic Components" by Shiaw–Jong S. Chen, et al.

* cited by examiner

*Primary Examiner*—Paula Bradley
*Assistant Examiner*—Tho D. Ta

(57) ABSTRACT

For use with a plate having a via located therethrough an electrical connector configured to transfer an electrical signal from one major surface of a plate to the other major surface, a method of manufacturing the electrical connector and a board mounted power supply utilizing the same. In one embodiment, the electrical connector comprises a dielectric layer coating a peripheral wall of the via and extending therefrom to coat portions of the opposing major surfaces of the plate adjacent the via. The electrical connector further comprises a conductive contact layer that covers a portion of the dielectric layer and extends to portions of the opposing major surfaces to form opposing contacts thereon.

12 Claims, 3 Drawing Sheets

THROUGH VIA PLATE ELECTRICAL CONNECTOR AND METHOD OF MANUFACTURE THEREOF

TECHNICAL FIELD OF THE INVENTION

The present invention is directed, in general, to an interconnect for an active cooling system and, more specifically, to a device for providing an electrical interconnection through a plate between an electronic device and another associated device.

BACKGROUND OF THE INVENTION

Designers of electronic circuits must incorporate into their designs methods to control heat generated by electronic components in the circuit. Unless controlled, the heat build-up will cause component and circuit failure. Temperature control, therefore, is vital to circuit reliability. The preferred method to controlling temperature is to dissipate the excess heat into the ambient air surrounding the electronic circuit before temperatures rise to a level where damage can occur.

The traditional method to contain temperature build-up is to associate heat generating components with heat dissipation devices, such as heat sinks. The heat dissipation device absorbs heat from the component and provides for a more efficient transfer of excess heat into the surrounding ambient air. In most cases, the heat generating component will be mounted directly to the heat dissipation device to more efficiently remove the excess heat.

Although traditional heat sinking methods can be used successfully in most cases, the problems associated with temperature control have become more pronounced as electronic circuits have become more complex. Such circuit complexity often results in a circuit that requires a larger number of components, which frequently are more powerful and can generate even more heat. The problem is further complicated by the fact that lower profile and more compact electronic systems have become the preferred choice of customers. This means that space must be found in such low profile, compact systems for both the electronic components that make up the circuit as well as the heat dissipation devices that such components require in order to prevent heat related damage. In short, as the power density of circuits has increased, the use of classic finned heat sinks may no longer adequately address the corresponding heat dissipation requirements.

Some of the foregoing problems have been resolved by using active, rather than passive, systems to control temperature build up. For example, certain board mounted electronic components that generate large amounts of heat can have an active cooling device, such as a small fan, dedicated solely to the device. In those situations where a fan is used as the active device, the fan is typically mounted directly on the component and improves cooling by moving more ambient air over the component. Using a fan in this manner will provide more efficient cooling in less space than a classic finned heat sink.

Notwithstanding the benefits of having an active cooling device associated directly with a heat generating component, active cooling devices have certain shortcomings. One shortcoming is that such a device requires its own power source in order to operate. Prior art methods of providing this power usually involved the provision of a separate wiring path for the active device. Such a path may be provided by using separate connector pins on the substrate that are directly connected to the active device. This solution to the power problem raises additional problems, such as the added manufacturing expense of connecting the active device to an electrical power source during the assembly process. Other detrimental factors may arise when the active device must be removed for replacement or maintenance. Usually the active device must be manually disconnected and, when reinstalled, manually reconnected. This increases maintenance time and the potential for error.

Accordingly, what is needed in the art is a device that can provide electrical power to an active cooling device mounted on an electronic device that does not require a separately wired circuit.

SUMMARY OF THE INVENTION

To address the above-discussed deficiencies of the prior art, the present invention provides an electrical connector for use with a plate having a via located therethrough that is configured to transfer an electrical signal from one major surface of the plate to the other major surface of the plate. In one embodiment, the electrical connector is comprised of a dielectric layer coating a peripheral wall of the via and extending therefrom to coat portions of the opposing major surfaces of the plate adjacent the via. The electrical connector is further comprised of a conductive contact layer that covers a portion of the dielectric layer and extends to portions of the opposing major surfaces to form opposing contacts thereon.

The present invention, in broad scope, introduces an electrical connector that can be used to receive an electrical signal from an electronic device coupled to one side of a plate and transfer that electrical signal to another electronic device coupled to the other side of the plate. For example, the present invention can be used to electrically interconnect a board mounted power device and an active cooling device where the baseplate of the active cooling device is mounted on top of the power device. The electrical interconnect can be used for a number of purposes, such as furnishing operating power to the active cooling device or providing a feedback signal from the cooling device to the board mounted power device.

One embodiment of the invention provides for the electrical connector to have a copper layer as the conductive contact layer covering the dielectric layer. Of course, any material used as a conductive layer covering the dielectric layer will be within the scope of the present invention.

A particularly useful embodiment of the invention provides for the electrical connector to be located proximate a plurality of other electrical connectors that extend through other vias in the plate. This is particularly advantageous where certain connectors are used to transfer power, perhaps of different voltages, through the plate while other connectors are used to furnish other information, such as temperature or air velocity.

In one embodiment of the invention, the electrical connector is formed through a via of a base plate for a board mounted power supply. In another aspect of this embodiment, the board mounted power supply has an output that is electrically connected to the electrical connector.

In still another embodiment, the invention provides for an active cooling device that is couplable to the plate. An aspect of this embodiment provides for the active cooling device to further include a spring contact that provides electrical connectivity with the electrical connector.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
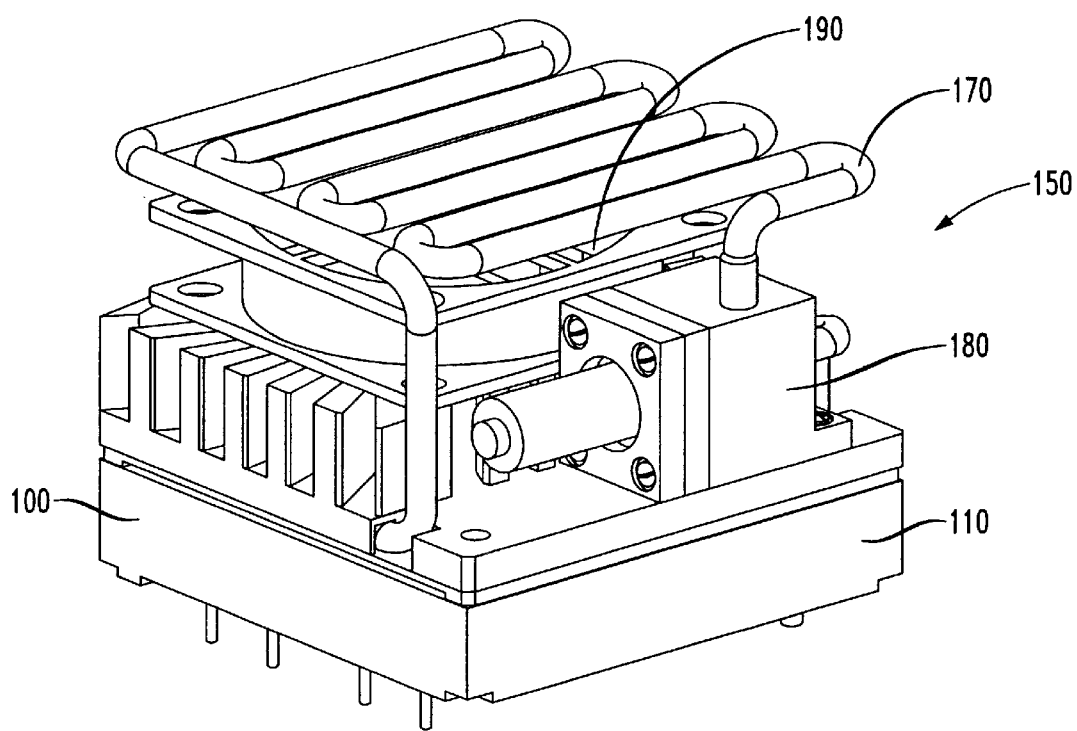
FIG. 1A illustrates an isometric view of an embodiment of a board mounted power supply constructed in accordance with the principles of the present invention.
Figure 1B:
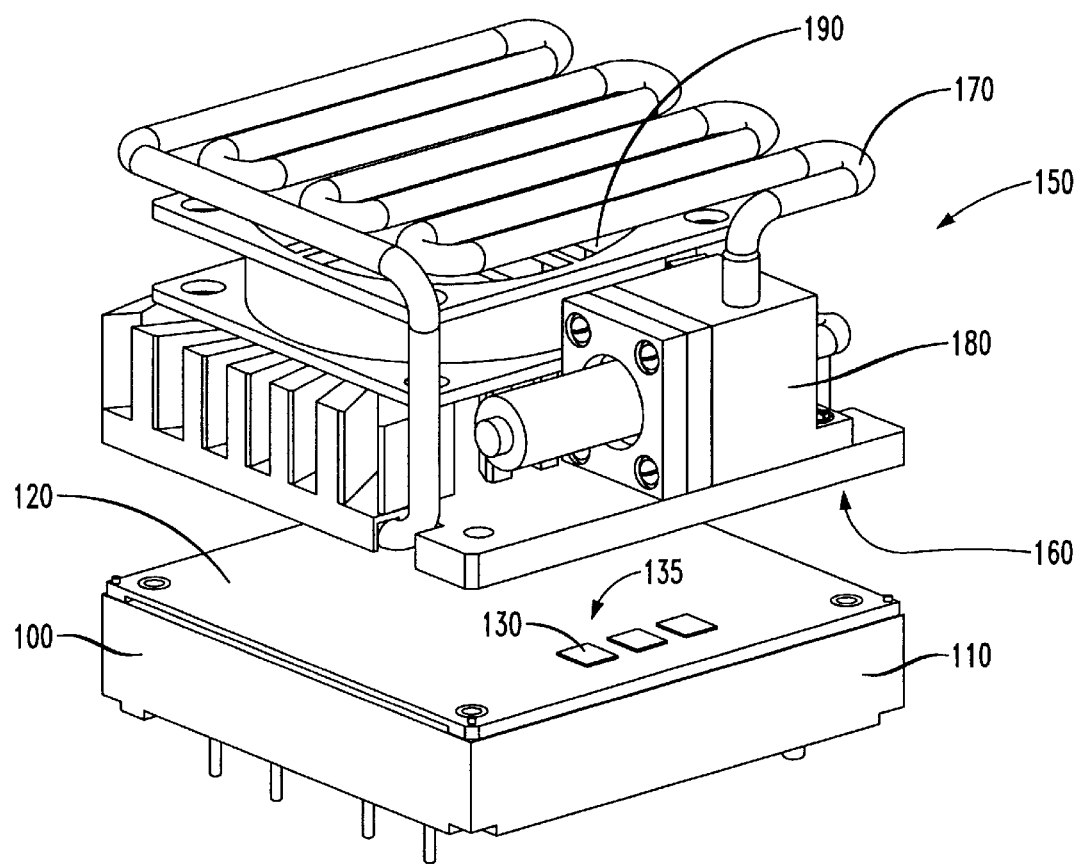
FIG. 1B illustrates another isometric view of the board mounted power supply of FIG. 1A.

Referring initially to FIGS. 1A and 1B, illustrated are isometric views of an embodiment of a board mounted power supply 100 constructed in accordance with the principles of the present invention. More specifically, FIG. 1A illustrates the board mounted power supply 100 with a top mounted integrated liquid cooling device 150 thereon. FIG. 1B illustrates another isometric view of the board mounted power supply 100 of FIG. 1A. The board mounted power supply 100 has the integrated liquid cooling device 150 separated to reveal a top view of the board mounted power supply 100.

With continuing reference to FIGS. 1A and 1B, the illustrated board mounted power supply 100 has a chassis 110 with power circuitry (not visible) located in the chassis 110. The power circuitry, including the rectifiers, switches, transformer or combination of such devices contained in the chassis 110 will be familiar to those skilled in the pertinent art. The board mounted power module 100 has a base plate 120 located thereon that substantially covers the chassis 110. The plate 120 has electrical connectors 130 associated with it, each of which is constructed in a via 135 through the plate 120, as hereinafter described. The power supply circuitry in the chassis 110 has an output to which at least one of the electrical connectors 130 is coupled.

The present invention is particularly advantageous when used in combination with the illustrated integrated liquid cooling device 150. The integrated liquid cooling device 150 is described in detail in U.S. patent application Ser. No. LUCT-120016, entitled INTEGRATED ACTIVE LIQUID COOLING DEVICE FOR BOARD MOUNTED ELECTRONIC COMPONENTS, to Chen, Shiaw-Jong, et. al., commonly assigned with the invention and incorporated herein by reference.

Located on the integrated liquid cooling device 150 are contacts 160 (not visible) that correspond to the electrical connectors 130 on the plate 120. When the integrated liquid cooling device 150 is mounted on the board mounted power supply 100, electrical connectivity will be established between the cooling device 150 and the electrical connectors 130. In order to assure electrical connectivity, in one embodiment of the invention, the contacts 160 on the cooling device 150 may be spring contacts.

The advantages of the present invention are clearly illustrated in FIGS. 1A and 1B. The integrated liquid cooling device 150 is commonly known in the art as an active cooling device. That is, instead of relying on a heat sink to passively conduct heat from a heat generating component of the board mounted power supply 100 to a surface where it is transferred to the surrounding ambient air, the cooling device actively gathers the heat from the component and transfers it to the surrounding ambient air.

In the present case, the integrated liquid cooling device 150 moves a coolant through a closed-circuit circulation pipe 170 to gather heat from the board mounted power supply 100 and transfer it to the surrounding ambient air. In order to pump the coolant through the closed-circuit circulation pipe 170, the cooling device 150 has a pump 180 that is coupled to the pipe 170. When the pump 180 moves the coolant to a position where it can readily be dissipated into the surrounding ambient air, a fan 190 moves air across the pipe 170 and accelerates the transfer of heat.

It is readily apparent that both the pump 180 and the fan 190 on the integrated liquid cooling device 150 require power in order to operate. Prior art solutions to providing power to the fan 190 and pump 180 would require power cords from the fan 190 and pump 180 to be connected to a power source. The present invention, however, advantageously provides electrical power to run the fan 190 and pump 180 directly from the power supply circuitry in the chassis 110. In the illustrated embodiment, the chassis 110 has an output to the electrical connector 130 on the chassis 110 side of the base plate 120. When the integrated liquid cooling device 150 is mounted on the board mounted power supply 100, the contacts 160 on the cooling device 150 complete the circuit through the connectors 130 formed through the vias 135 in the base plate 120 to provide electrical power to the pump 180 and fan 190.

Although the present invention requires only one electrical connector 130, in the illustrated embodiment, a plurality of vias 135 and connectors 130 are provided. The plurality of connectors 130 can be used for a variety of purposes, including powering more than one device or providing feedback of temperature and other useful information to the board mounted power supply 100.

Figure 2:
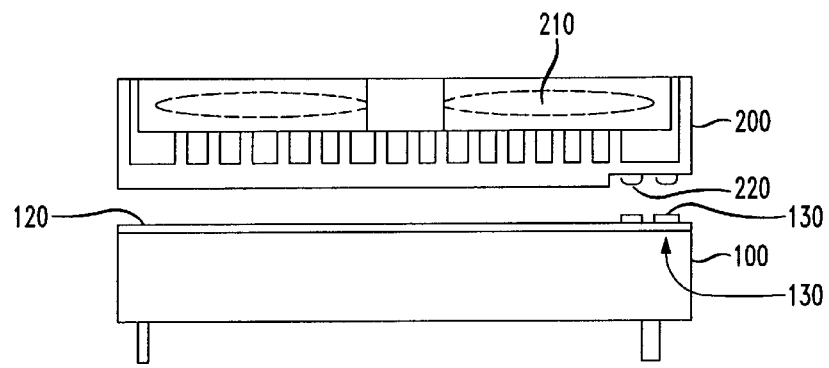
FIG. 2 illustrates a planar side view of the board mounted power supply of FIG. 1A and an unmounted active cooling device.

Turning now to FIG. 2, illustrated is a planar side view of the board mounted power supply 100 of FIG. 1A and an unmounted active cooling device 200. This embodiment illustrates the provision of electrical power to an active cooling device 200 that is only using a fan 210. The power module 100 has a base plate 120 with electrical connectors 130 in vias 135 through the base plate 120. An output of the board mounted power supply 100 is electrically connected to the electrical connectors 130. This embodiment of the active cooling device 200 has spring contacts 220. When the active cooling device 200 is mounted on the board mounted power supply 100, the contacts 220 will be electrically connected to the electrical connectors 130 and provide electrical power to run the fan 210. Other contacts 220 may be connected to other electrical connectors 130 to provide power to other devices or to provide feedback information.

Figure 3:
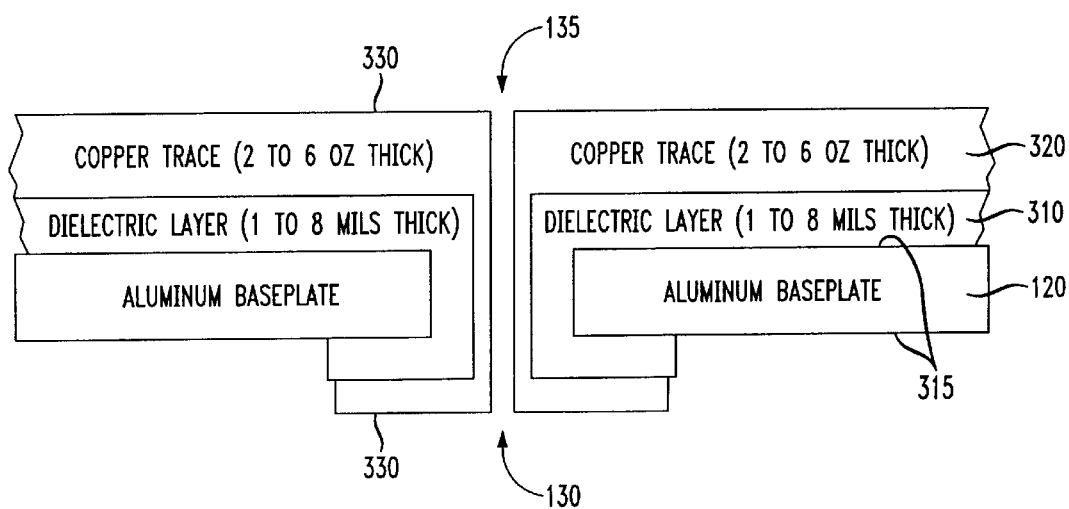
FIG. 3 illustrates a cross-sectional view of an embodiment of an electrical connector constructed in accordance with the principles of the present invention.

Turning now to FIG. 3, illustrated is a cross-sectional view of an embodiment of an electrical connector 130 constructed in accordance with the principles of the present invention. The electrical connector 130 is employable with a plate 120 having a via 135 located therethrough. The via 135 has a dielectric layer 310 coating a peripheral wall of the via 135 and extending therefrom to coat a portion of an opposing major surface 315 on each side of the plate 120 adjacent to the via 135. In the illustrated embodiment, the dielectric layer 310 may be 1 to 8 mils thick. Of course, the thickness of the dielectric layer 310 may be modified as a particular application may dictate.

Covering a portion of the dielectric layer 310 is a conductive contact layer 320 that covers a portion of the dielectric layer 310 and extends to portions of the opposing major surfaces 315 to form an opposing contact 330 on each of the opposing major surfaces 315. Those skilled in the pertinent art will readily understand and recognize that an electrical power source connected to the contact 330 on one side of the plate 120 will be electrically connected to the contact 330 on the opposing side of the plate 120. In the illustrated embodiment, the conductive contact layer 320 is a copper layer that is 2 to 6 ounces thick. Of course, the thickness of the copper layer may be modified as a particular application may dictate. Although the illustrated embodiment of the invention provides for the conductive contact layer 320 to be comprised of copper, other conductive materials, such as platinum, gold, silver, etc., can also be used as the conductive contact layer 320.

Although the present invention has been described in detail, those skilled in the art should understand that they can make various changes, substitutions and alterations herein without departing from the spirit and scope of the invention in its broadest form.

What is claimed is:

1. An electrical connector for providing electrical power to an active cooling device coupled to a power supply chassis, comprising:

a chassis cover-plate of said chassis having a via located therethrough;

a dielectric layer coating a peripheral wall of said via and extending therefrom to coat portions of opposing major surfaces of said chassis cover-plate adjacent said via; and a conductive contact layer covering a portion of said dielectric layer and extending to said portions of said opposing major surfaces to form opposing contacts of said connector thereon.

2. The electrical connector as recited in claim 1 wherein said conductive contact layer comprises copper.

3. The electrical connector as recited in claim 1 wherein said electrical connector is located proximate a plurality of other electrical connectors extending through other vias in said chassis cover-plate.

4. The electrical connector as recited in claim 1 further comprising power supply circuitry located within said power supply chassis having an output electrically connected to said electrical connector.

5. The electrical connector as recited in claim 1 wherein said active cooling device couplable to said chassis cover-plate.

6. The electrical connector as recited in claim 5 wherein said active cooling device further includes a spring contact providing electrical connectivity with said electrical connector.

7. A method of manufacturing an electrical connector for providing electrical power to an active cooling device coupled to a power supply chassis, comprising:

providing a chassis cover-plate for said chassis having a via located therethrough;

coating a peripheral wall of said via with a dielectric layer, said dielectric layer extending from said peripheral wall to coat portions of opposing major surfaces of said chassis cover-plate adjacent said via; and covering a portion of said dielectric layer with a conductive contact layer, said conductive contact layer extending to said portions of said opposing major surfaces to form opposing contacts of said connector thereon.

8. The method of manufacturing an electrical connector as recited in claim 7 wherein said conductive contact layer is formed by plating.

9. The method of manufacturing as recited in claim 7 wherein said chassis cover-plate has a plurality of vias therethrough and forming a plurality of said electrical connectors.

10. The method of manufacturing an electrical connector as recited in claim 7 further comprising providing power supply circuitry within said power supply chassis that is electrically connected to said electrical connector.

11. The method of manufacturing an electrical connector as recited in claim 7 further comprising an active cooling device couplable to said chassis cover-plate.

12. The method of manufacturing an electrical connector as recited in claim 11 wherein said active cooling device further includes a spring contact providing electrical connectivity with said electrical connector.

* * * * *